United States Patent [19]
Minemier et al.

[11] Patent Number: 6,093,938
[45] Date of Patent: Jul. 25, 2000

[54] STACKED DIE INTEGRATED CIRCUIT DEVICE

[75] Inventors: Ronald K. Minemier, Tempe; Jon M. Dhuse, Chandler, both of Ariz.

[73] Assignee: Intel Corporation, Santa Clara, Calif.

[21] Appl. No.: 09/318,778

[22] Filed: May 25, 1999

[51] Int. Cl.[7] .............................. H01L 31/00; H01L 27/15
[52] U.S. Cl. ................................. 257/80; 257/81; 257/84
[58] Field of Search .................................. 257/80, 81, 82, 257/83, 84

[56] References Cited

U.S. PATENT DOCUMENTS

| | | |
|---|---|---|
| 4,058,821 | 11/1977 | Miyoshi et al. . |
| 4,100,562 | 7/1978 | Sugawara et al. . |
| 5,093,879 | 3/1992 | Bregman et al. . |
| 5,148,243 | 9/1992 | Merrick et al. . |
| 5,401,983 | 3/1995 | Jokerst et al. ............................. 257/82 |
| 5,545,893 | 8/1996 | Brown et al. ............................ 250/239 |
| 5,654,559 | 8/1997 | Spaeth et al. ............................ 257/82 |
| 5,714,772 | 2/1998 | Fang et al. ............................... 257/82 |
| 5,753,928 | 5/1998 | Krause .................................. 250/551 |
| 5,883,395 | 3/1999 | Krause .................................. 250/551 |

*Primary Examiner*—Ngân V. Ngô
*Attorney, Agent, or Firm*—Trop, Pruner & Hu, P.C.

[57] ABSTRACT

A compound die may be formed of two dies each having face and back sides, said dies being connected with said dies in face to face alignment. A radiation communication system may be used to assist in aligning the dies and in providing communications between the two dies. In this way, a composite structure may be produced which has advanced capabilities, a small footprint, and low impedance.

8 Claims, 4 Drawing Sheets

STACKED DIE INTEGRATED CIRCUIT DEVICE

BACKGROUND

This invention relates generally to integrated circuit devices made up of more than one die.

In a number of integrated circuit applications, relatively complex functions may be involved. Thus, in some cases, the capabilities desired to be integrated into a single integrated circuit die may exceed the available processing capabilities. Some functionalities are placed on one die and other functionalities are placed on another die.

The packaged dies may then be coupled together, for example by securing them to printed circuit boards having metallic interconnections to connect signals travelling between the two dies. This has the disadvantage that the footprint or size of the combined integrated circuit device is increased because spacing is needed between the dies to allow the desired interconnections. In addition, the resulting device may be slower due to the impedances arising from the metallic interconnections and the contacts to each die.

Thus, there is a continuing need for techniques for providing advanced functions in compact, multiple die integrated circuits.

SUMMARY

In accordance with one aspect, an integrated circuit device includes a pair of dies each having a face and a back. The dies are coupled together with their faces opposed to one another. One of the dies has a radiation emitter and the other of the dies has a radiation detector arranged to detect the radiation emitted by the emitter.

DETAILED DESCRIPTION

Figure 1:
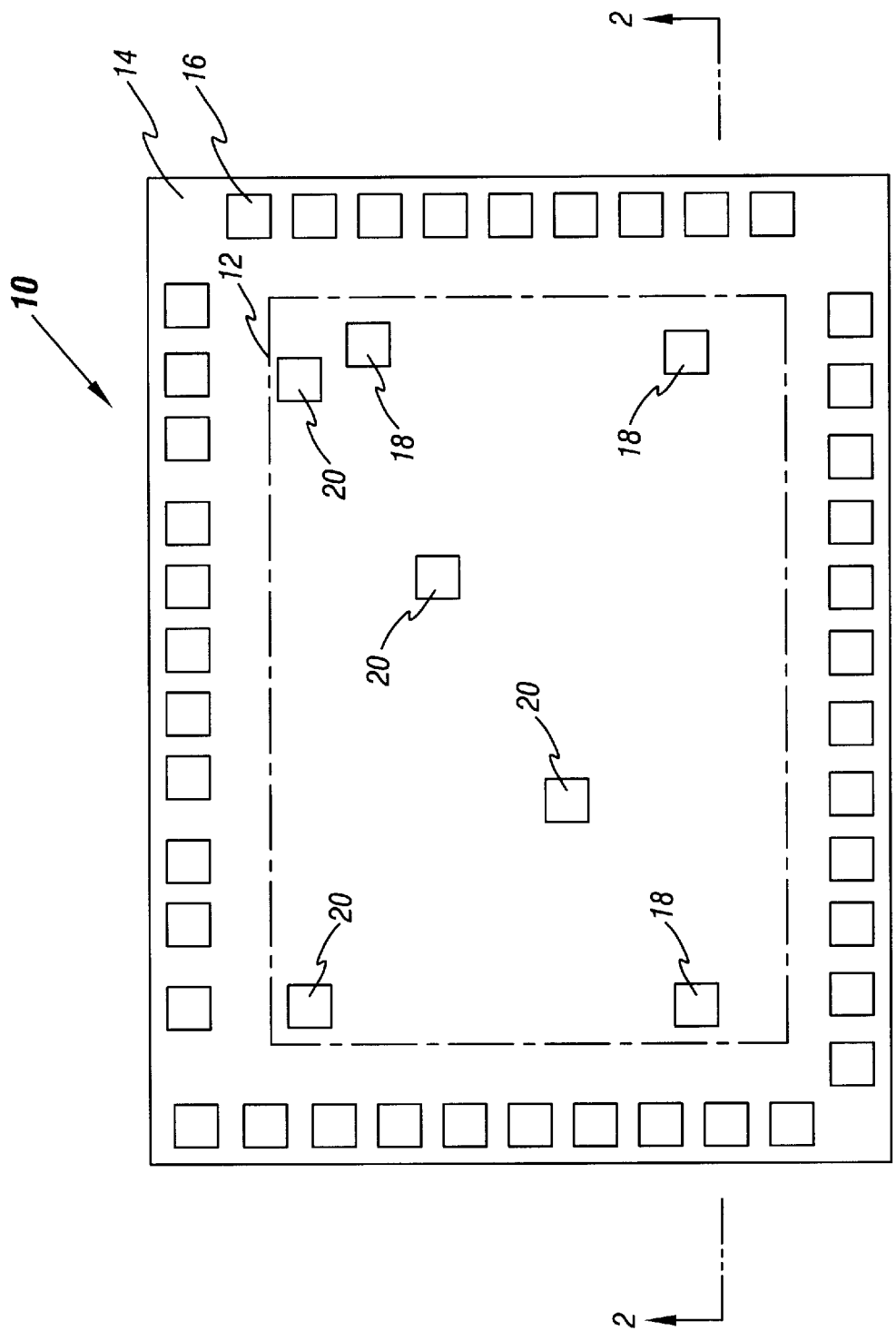
FIG. 1 is an enlarged top plan view of a die in accordance with one aspect of the present invention showing the location of a second die over a first die.

A first die 10, shown in FIG. 1, may include a face 14 and a plurality of contact pads 16 positioned peripherally about the die 10. By "face" it is intended to refer to the side of the die with integrated circuits formed therein. The back of the die is on the opposite side of the face. A number of heat activatable bond areas 18 may be distributed around the central region 12 of the die 10. A plurality of radiation or visible light emitting elements 20 may also be distributed about the central region 12.

Figure 2:
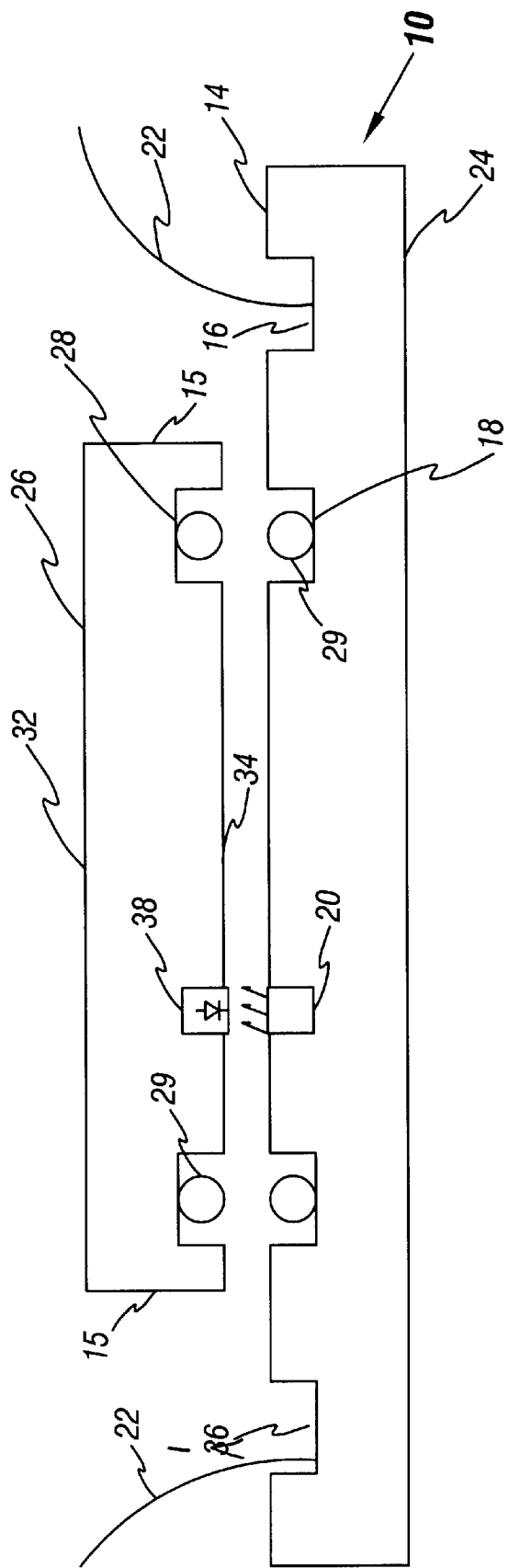
FIG. 2 is an enlarged cross-sectional view taken generally along the line 2—2 of FIG. 1 when the second die is positioned over the first die.

As shown in FIG. 2, a second die 26 may be positioned over the central region 12 of the first die 10 such that the face 34 of the second die 26 is opposed to the face 14 of the first die 10. In this arrangement, the contact pads 16 are freely accessible since the first die 10 extends beyond the edges 15 of the second die 26. Thus, contacts 22 may be made to the pads 16.

Figures 3, 4A, 4B, 6, 7:
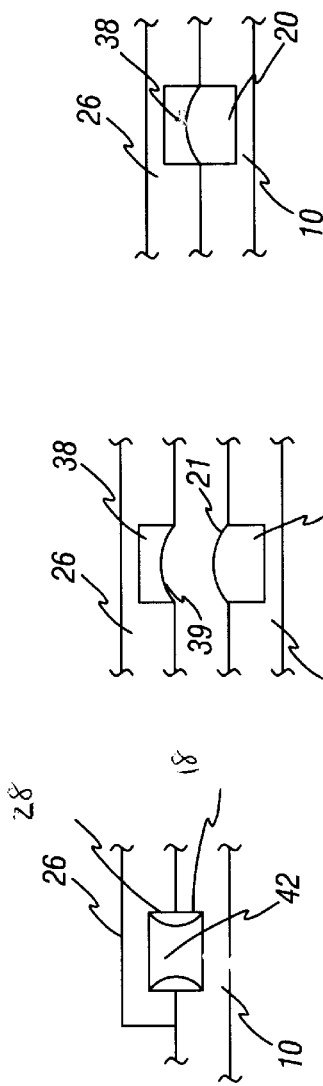
FIG. 3 is a partial, enlarged, cross-sectional view showing one technique for interconnecting the dies in accordance with one embodiment of the present invention.
FIG. 4A is an enlarged, partial cross-sectional view showing the light emitter and light detector of FIG. 2 being aligned with one another.
FIG. 4B is an enlarged, partial cross-sectional view corresponding to FIG. 4A, but after the dies have been combined.
FIG. 6 is a block diagram of a microprocessor die in accordance with one embodiment of the present invention.
FIG. 7 is a block diagram of a second die for completing the microprocessor shown in FIG. 6.

Each of the bond areas 18 on the die 10 is aligned with bond areas 28 on the second die 26. Thus, as shown in FIG. 3, the bond areas 18 and 28 may be heat activated to form a soldered contact 42 joining the two dies 10 and 26. The heat activation may also be the result of the application of energy to the bond areas, for example by applying ultrasonic energy. For example, in one embodiment of the present invention, the bond areas 18 and 28 may include solder balls 29 of the type used in conventional chip on board (COB) and flip chip packaging. In this way, the solder balls 29 may be placed in contact with one another and then simultaneously all the bond areas may be secured together in a heat reflow step. This secures the dies 10 and 26 together in face to face alignment. In addition the contact 42 may provide for power or ground connections between the dies 10 and 26.

At the same time, one or more radiation emitting elements 20 on the first die 10 may be aligned with receptors 38 contained in the second die 26 as shown in FIG. 2. While in the illustrated embodiment, the receptors 38 are in the die 26 and the emitting elements 20 are on the die 10, any combination of receptors 38 and emitting elements 20 may be split between the two dies depending on the direction that radiation or light signals are being pushed.

Thus, the pairs of elements 20 and receptors 38 enable signals to be communicated between the two dies. These signals may be in the form of data, control or address signals to enable the two dies to work together in an advantageous fashion without unduly increasing the system impedance. While only four pairs are illustrated, in some embodiments many more pairs of elements 20 and receptors 38 may be used.

In accordance with one embodiment of the present invention, the emitting elements 20 may have a rounded upper surface 21, for example, formed of a spherical microlens as shown in FIGS. 4A and 4B. The upper surfaces 21 mate with a correspondingly shaped surfaces 39 on the receptors 38. In this way, the complementary shapes physically align the dies 26 and 10, while preventing obstruction of the radiation or light signals travelling between the two dies.

Figure 5:
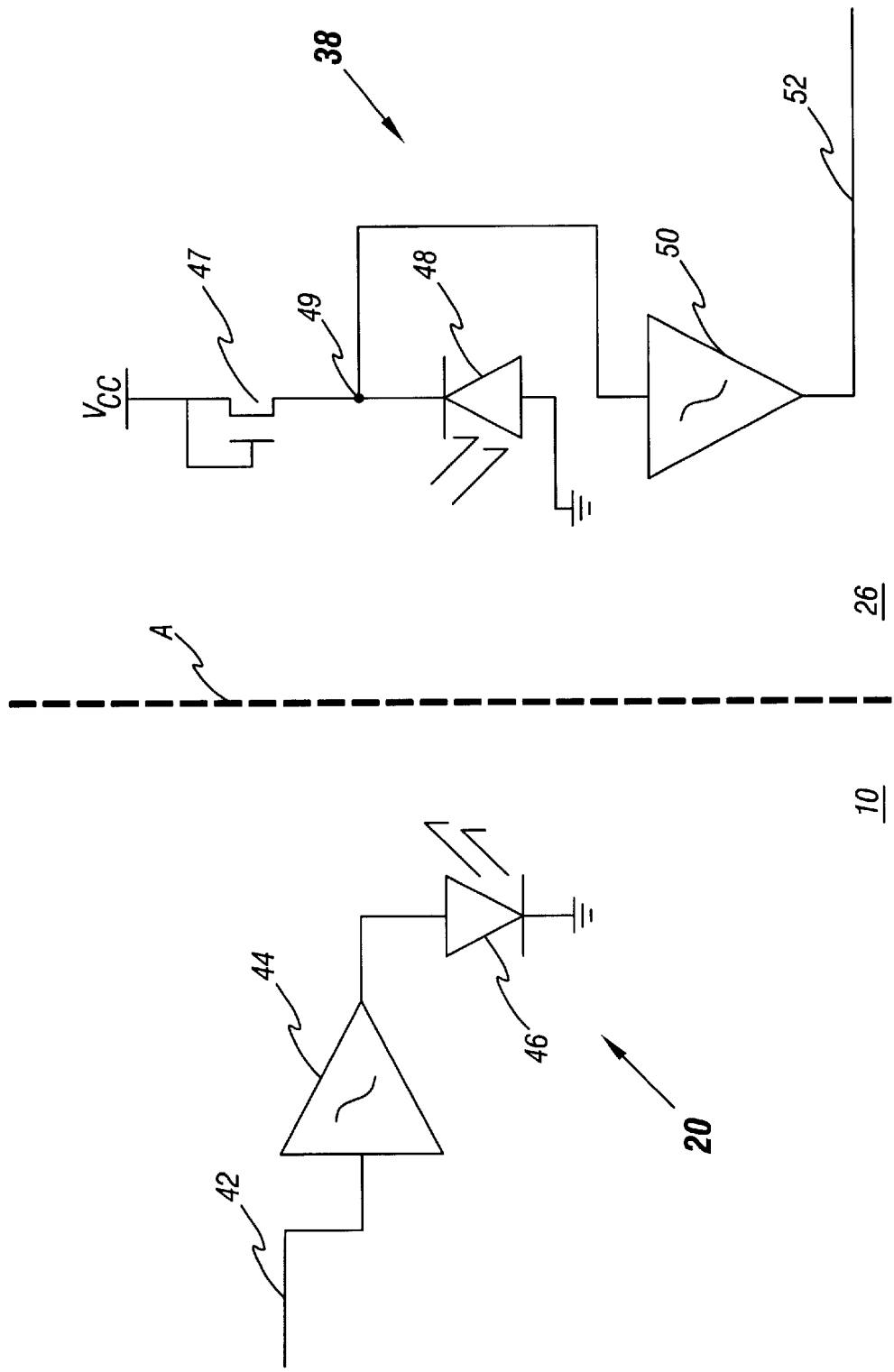
FIG. 5 is a block depiction of the circuits for generating and detecting light in accordance with one embodiment of the present invention.

Referring now to FIG. 5, on the left side is the die 10 and across the boundary A between the dies is the die 26. In one embodiment of the invention, light emitting elements 20 receive a logic signal on a line 42. A Schmitt trigger driver 44, coupled to the line 42, drives a light emitting diode 46. While a single element 20 is shown, an array of such devices may be used in some embodiments, driven by an array of driver circuits including Schmitt trigger drivers 44.

The light generated by the light emitting diodes 46 may be detected by the receptors 38 on the die 26. In one embodiment, a load device 47 is coupled to a power supply, Vcc, on one end and to a photodiode 48 coupled to ground on the other end. The potential on the node 49 is a function of the light detected by the photodiode 48. The potential at the node 49 is detected by the Schmitt trigger 50 to form an output logic signal on the line 52. Again, a pair of devices 20 and 38 may be provided on each of the dies to provide light communications between the two dies.

For a typical silicon PIN photodiode, switching speeds can be on the order of 5 gigahertz and higher. If an avalanche photodiode is used, its speed may be in the range of 100 gigaghertz. On the emitter 20 side, switching speeds can be, for some forms of light emitting diodes, from 100 to 500 megahertz. For laser diodes, the switching speed can be ten times higher than that of typical light emitting diodes. To further increase emitter speed, a reduced swing or reduced photon flux signaling process can be used where a light emitting or laser diode is not fully turned "off" or "on". Instead, a flux intensity is modulated between full "off" and "on" that can easily be discriminated by the photoreceptor 28. Thus, the photoreceptor/emitter pair can provide very high data transfer rates.

Referring now to FIGS. 6 and 7, in accordance with one embodiment of the present invention, a microprocessor may be implemented by the dies 10 and 26. The conventional components of a microprocessor core may be incorporated into the die 10 while the cache memory may be integrated into the die 26. For example, an array 80 of emitting elements 20 on the die 10 (FIG. 6) may transmit cache read requests and cache write requests to the cache memory on the die 26, shown in FIG. 7, through the array 86 of receptors 38. Similarly, an array 82 of receptors on the die 10 may receive cache data from an array 84 of emitting elements on the die 26. In addition, power and ground signals may be shared through mating contacts 88 and 104, shown in FIGS. 6 and 7 respectively.

Referring to FIG. 6, the processor core 94 may be coupled to a bus interface 92 which interfaces with an external bus 90 in one embodiment of the invention. The bus interface 92 also interfaces with a backside bus interface 96. The backside bus 98, 100 may be a dedicated bus which couples the processor core 94 and the level two (L2) cache 102, shown in FIG. 7. For example, the backside bus may be a 36 bit address bus and a 64 bit data bus. In the event of a miss on the level one (L1) data or code caches, the L2 cache may be accessed through the backside bus 100, 98 at the same time that the processor or any other bus agent is using the external bus 90. The core 94 interfaces to the L2 cache 102 via the backside bus 98, 100 and with external devices through the external bus 90 which, in some embodiments, may be a card edge connector. Thus, tight coupling may be achieved between the processor core 94 and the L2 cache 102 using embodiments of the present invention.

In some embodiments an L1 cache may be placed on the same die as the logic circuits and an L2 cache may be located on the other die. In other embodiments, the L1 and L2 caches may be on the same die. In another embodiment, a microprocessor may be on one die and the system memory may be on the second die. In still another embodiment, a north bridge may be on one die and the microprocessor may be on the other die. In yet another embodiment, an accelerated graphics port (AGP) chip may be on one die and a microprocessor may be located on another die. In another embodiment, a microprocessor may be located on one die and a floating point unit is on the other die.

The dies 10, 26 may be aligned using an active fiducial process to include close matching between the receptors and the emitting elements which may be light emitting diodes (LEDs). The base die 10 may be powered and may use four separate LEDs that reflect off the substrate of the die 26 during alignment and die coupling. The feedback of the beam provides a closed loop positioning system.

While an application has been illustrated in which one die is a microprocessor and the other die is a cache memory, a number of other applications using the techniques described herein may also be used. For example, one die may be part of a microprocessor and the other die may be a section of the same microprocessor overall design. Similarly, one die may be largely logic based and the other die may be analog based. Other applications include having one die which is made by one process and another die which needs a separate manufacturing process. Thus, in some cases, one die may include logic circuits and the other die may include memory devices such as FLASH memory or electrically erasable programmable read only memory(EEPROM).

The dies may use conventional semiconductor substrates such as silicon, or germanium arsenside, but the technique is not limited to these substrate types. Any substrate material that can support construction of emitters on one side, and detectors on the other side, and can be mated together in close proximity can implement this technique. Moreover, one die may use a different substrate material than the other die. The radiation or light emitting elements may include conventional LEDs and the light detecting elements may include conventional photodiodes. Alternatively, semiconductive polymer light emitting elements such as poly (methylethylhexyloxy-p-phenylenevinylene) (MEH-PPV) may be used. As still another alternative, infrared radiation emitting diodes may be used. As still another alternative either the emitter and/or the detector may be constructed using amorphous silicon, on a variety of different substrate types.

Embodiments of the present invention may achieve one or more of the following advantages. A very large number of interconnects may be made between the dies. In some embodiments, massively switched structures of data paths can be constructed. The light based interconnect method allows signals to be switched from the closest origin point to the closest destination point in the receiving circuit. For example, a bus structure does not have to be constrained to a linear space in the two dies. This may save overall substrate area and lower the cost of the end product. Because the light based interconnect method can essentially be random across the substrate surface area, parasitic effects such as inductance, resistance and capacitance of constrained conventionally routed circuits may be lessened or avoided, thereby improving performance. Because the interconnect system may be in the form of light, for example, and at very small distances, the speed of the interconnect may be high. Similarly, translations of digital to analog signals and vice versa may be easily made. Using these techniques may allow new and novel circuits and systems to be constructed. Having the two dies stacked in close proximity allows thermal removal to occur between both sides of the combined substrate. Thus, for a given footprint area, there may be more surface area available to remove heat.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A microprocessor comprising:
    a first die including a microprocessor core;
    a second die including a memory for said microprocessor core; and radiation receptors and transmitters on said dies to allow said microprocessor core on said first die to communicate with said memory on the second die.

2. The microprocessor of claim 1 wherein said memory is a cache memory.

3. The microprocessor of claim 2 wherein said cache memory is a level two cache memory.

4. The microprocessor of claim 1 wherein said dies are joined together using heat activation techniques.

5. The microprocessor of claim 1 wherein said dies are fixed together in face-to-face abutment.

6. The microprocessor of claim 5 wherein said first die is larger than the second die such that electrical contacts can be made to said first die.

7. The microprocessor of claim 5 wherein said receptors and transmitters are in contact with one another.

8. The microprocessor of claim 1 including contacts for sharing power between the first and second dies.

* * * * *